United States Patent [19]

Tak

[11] Patent Number: 5,515,045
[45] Date of Patent: May 7, 1996

[54] MULTIPURPOSE OPTICAL INTELLIGENT KEY BOARD APPARATUS

[75] Inventor: Seung H. Tak, Seoul, Rep. of Korea

[73] Assignee: ILJIN Corporation, Seoul, Rep. of Korea

[21] Appl. No.: 162,048

[22] PCT Filed: Jun. 5, 1992

[86] PCT No.: PCT/KR92/00021

§ 371 Date: Feb. 14, 1994

§ 102(e) Date: Feb. 14, 1994

[87] PCT Pub. No.: WO92/22864

PCT Pub. Date: Dec. 23, 1992

[30] Foreign Application Priority Data

Jun. 8, 1991 [KR] Rep. of Korea .................... 1991-9486

[51] Int. Cl.⁶ ................................................. H03K 17/94
[52] U.S. Cl. .................. 341/23; 341/22; 341/31; 400/477
[58] Field of Search ................................. 341/21, 22, 23, 341/28, 31, 26; 400/477; 345/173, 176

[56] References Cited

U.S. PATENT DOCUMENTS

| | | | |
|---|---|---|---|
| 4,078,257 | 3/1978 | Bagley | 345/176 |
| 4,379,968 | 4/1983 | Ely et al. | 250/229 |
| 4,417,824 | 11/1983 | Paterson et al. | 400/477 |
| 4,502,048 | 2/1985 | Rehm | 341/22 |
| 4,542,375 | 9/1985 | Alles et al. | 345/176 |
| 4,688,020 | 8/1987 | Kuehneman et al. | 341/23 |
| 4,812,831 | 3/1989 | Laier | 341/23 |
| 4,827,085 | 5/1989 | Yaniv et al. | 345/176 |
| 4,836,636 | 6/1989 | Obara et al. | 400/477 |
| 4,855,740 | 8/1989 | Muramatsu et al. | 341/23 |
| 4,897,651 | 1/1990 | DeMonte | 341/23 |
| 5,034,602 | 7/1991 | Garcia, Jr. et al. | 341/23 |
| 5,164,723 | 11/1992 | Nebenzahl | 341/23 |
| 5,311,175 | 5/1994 | Waldman | 341/23 |
| 5,383,735 | 1/1995 | Smiley | 345/173 |

FOREIGN PATENT DOCUMENTS 89239  9/1983  European Pat. Off. .
3417997  1/1985  Germany .

Primary Examiner—John K. Peng
Assistant Examiner—Ashok Mannava
Attorney, Agent, or Firm—Ronald J. Kubovcik

[57] ABSTRACT

A multipurpose optical intelligent key board apparatus permitting a plurality of key tops made of transparent materials in an optical dot matrix arrangement to be moved upward and downward. It forces the corresponding positions of the optical dot matrix to be turned on or off, so that a computer or an electronic appliance can be operated by predetermined key inputs. Therefore, the function command words and characters appearing on the key tops are displayed by a display device supported by its software.

12 Claims, 9 Drawing Sheets

MULTIPURPOSE OPTICAL INTELLIGENT KEY BOARD APPARATUS

BACKGROUND OF THE INVENTION

1. Field of the Invention

The present invention relates to a key board adapted for use in appliances such as computers or related terminals, etc., and more particularly, to a multipurpose optical intelligent key board apparatus affording the user a variety of key inputs.

2. Description of the Related Art

A general key board is called an "input device" and when adapted to an electronic appliance, it is arranged to have a predetermined number of keys, each associated with a corresponding function. In other words, a key board used in an appliance such as a computer or related terminal is commonly supplied with keys bearing English characters. In many foreign countries, each English character on a specific key is accompanied by a corresponding character in the mother country tongue, whereby the two different characters are printed or moulded in a predetermined arrangement to be harmonized with the corresponding literary syntax system. Furthermore, because the literary syntax systems in each of the European Alphabetic countries have a greater range of characters and vowel possibilities than the English language, the key boards in each corresponding country force the positions of the keys produced in a new key board pattern. Typical characters used include those used in the German, French, Spanish languages.

During the 1980s, various computer software programs became standardized by using personal computers compatible with IBM-PCs which utilize "MS-DOS" software. To keep up with these developments, a computer key board is provided with ten or twelve keys having different purposes of use, called "function keys", which serve functions according to the software to be used. These "function keys", along with "ALT, CTRL, SHIFT and other Keys" are supported by various command words associated with their combination according to the software programming. However, it is inevitable to issue different command words corresponding to the programming of each software program because of the characteristics of the software. Nevertheless, standardization for the use of these keys has been impossible till now. Therefore, computer users are required to study the operating manual and ask the computer for help by pressing the function key F1 or a HELP key. Also, it takes a long time to become familiar with the corresponding program, and the use of new software requires learning its procedures. Most programming corresponding to the software to be used is utilized only on the basis of several command words being well known to the user, and the efficiency of use of the software is thereby reduced.

One part of most applied software programs divides a particular portion of a terminal screen, or it supports the user facility based on the window concept. However, these functions occupy part of the memory area independent of the predetermined memory region for starting the main program to be used. Therefore, it limits the operating capacity of a computer and thereby deteriorates the operating efficiency.

Software such as "AUTOCAD" is configured to use two screens, one of which becomes exclusively a command word space and the other of which forms the working space. This multi-screen system causes inconvenience, it is non-economic, and it is inefficient for the user. Touch screens or Liquid Crystal Touch screens have been developed as alternatives for resolving these problems, but these methods have disadvantages in respect of the user's degree of acquaintance with them and errors in operation caused by careless mistakes.

Considering these points, the main object of the present invention is to provide a multipurpose optical intelligent key board apparatus for performing the optical supporting operation with respect to all programming of software.

Another object of the present invention is to provide a multipurpose optical intelligent key board apparatus for supporting any language, in addition to a mother native tongue, to be used with respect to all keys on a key board.

Also, another object of the present invention is to provide a multipurpose optical intelligent key board apparatus for enabling all keys on the key board to represent the software command words, thereby functioning as a command word interface.

Another object of the present invention is to provide a multipurpose optical intelligent key board apparatus for supporting the software of a key board itself, in which the arrangement of the key board can be changed to permit all the keys to show computers command words which correspond to the software programming to be used.

Still another object of the present invention is to provide a multipurpose optical intelligent key board apparatus which allows the operation of all keys on the key board as function keys and the operation of corresponding command word keys for the control of a particular electronic appliance.

SUMMARY OF THE INVENTION

The present invention comprises: a key board means receiving all key top means in a predetermined arrangement, a plurality of key top means made of transparent materials, such as epoxy resin, acryl resin, glass or crystal in the form of a cube or a rectangle which cad be switched to represent auxiliary command words and characters; a plurality of light interrupting means for retaining the respective key tops, to block an coherent or incoherent light beam; means for elastically supporting all pairs of a key top means and a light interrupting means, a middle plate made of metal with a configuration the same as that of the key board means and which supports all elastic means and light interrupting means; an optical means for sensing the operation of the key top means during the downward moving of the light interrupting means out of the lower portion of the middle plate to block the light beam; a display means in the form of a Liquid Crystal Display(LCD) or Light Emitting Display-(LED) and an optical device in a dot matrix arrangement which is capable of freely changing a character pattern to match the configuration of the key board means having a plurality of key top means according to the application of the software to be used; and an illuminating means including a luminescence emitting plate which operantes by means of a minimum current at the bottom portion of the display means.

Thus, the present invention provides a controllable display means capable of changing a given software program operation to represent a given function key on a corresponding key top to provide an auxiliary character arrangement as well as to operate the corresponding electronic appliance by forcing the light sensing device to interrupt the function of the corresponding key top when it is pressed.

This optical key board apparatus is e to represent all characters used in every language by providing a key board utility software without the necessity of printing characters on all of the key tops according to one unique language.

The optical intelligent key board can also display the role of function keys used in all applied software programs on a LCD or LED and an optical device below the bottom portion of each of the key tops. This display state is visually recognized through each of the key tops made of transparent materials, thereby creating a key board which enhances the user's convenience. As a result, a manual corresponding to each particular applied software is reduced, and the display of the functions of the applied software is maximized to overcome any disadvantage caused by the user's partial knowledge.

The present invention furthermore can provide a multipurpose intelligent key board apparatus compatible with any software programming. The multipurpose intelligent key board apparatus can be adapted to a note-book PC and lap-top computer, so that it may be used like an exclusive use terminal of a word-processor, a data base computer and a spread sheet. It can not only be adapted to the key board of a Position Of System(POS) terminal and a portable telephone, but also to achieve various additional function as well as the reduction of the number of key switches on the key board.

BRIEF DESCRIPTION OF THE DRAWINGS

The present invention will now be explained in detail with respect to the attached drawings, in which:

FIGS. 6A and 6B are cross-sectional views illustrating the assembly of the present invention, in which FIG. 6A illustrates the state of a key top when fitted into a light interrupting device;

DESCRIPTION OF THE PREFERRED EMBODIMENTS

Figure 1:
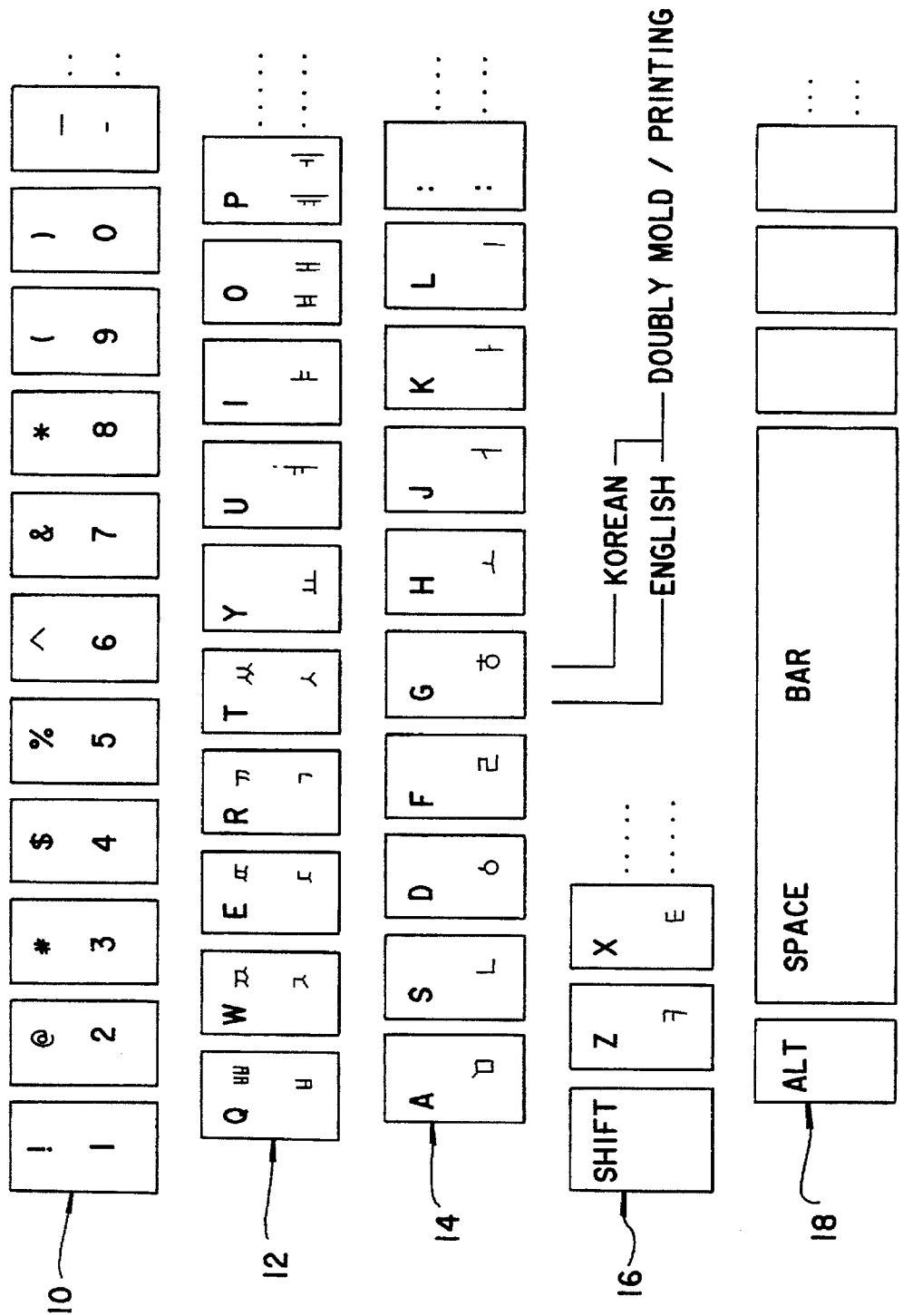
FIG. 1 is a plan view showing the arrangement of a conventional key board corresponding to an AT type computer.

FIG. 1 shows parts of a conventional AT type key board adapted to the IBM PC, which includes an arrangement of both Korean and English characters. The key board is provided with a plurality of key top groups 10, 12, 14, 16, 18. . . each arranged by line, each group consisting of key tops on which corresponding characters are printed. For example, the key top group 10 in the first line is arranged so that the key tops respectively represent FIGS. 1, 2. . . and the predetermined alternate characters !, @. . . which are selected by using the SHIFT key. The key top group 12 has key tops in one line which represent the English capital letters Q, W, E. . . and alternate Korean characters, which are selected by using the SHIFT key, and the English lower case q, w, . . . and alternate Korean characters which are selected without the SHIFT key. The ALT key of the key top group 18 performs a special function when used in combination with one of the other key tops.

These key top switches on the conventional key board let their upper plan portion be printed upon with the predetermined corresponding characters or are doubly moulded to have the predetermined corresponding characters. The configuration of the key top switches may be variously adapted to the mechanical contact type, the electrostatic capacity change type or the membrane type, etc. However, even though only one of the key top switches, becomes out of order, the key board can only be repaired by being totally disassembled.

In light of these points, the present invention includes a plurality of key top switches located in a transparent rectangular or other predetermined shape using materials, such as glass, acryl, plastic or crystal. These materials are able to transmit the light by optical refraction to create visible characters, graphs and figures represented in a display device such as a LCD screen which is positioned below the keyboard bottom surface, thereby creating the same effect as those on the printed key board. Thus, a light transmitting key board is constructed in order for its key tops of transparent materials to visually display characters, graphs and figures represented by a display device in either the original proportion or in a reduced or enlarged proportion by means of optical refraction.

First, the key tops are respectively coated or covered on their vertical lower side surfaces by opaque materials, so that they are positioned in a horizontal plane at X and Y coordinates like a matrix arrangement of more than 6*32 consisting of infrared ray receiving and emitting elements, thereby detecting the light blocking positions. The transparent key tops also are coated on their vertical surfaces by opaque materials, and an optical wave guider of transparent materials is positioned therebetween to guide infrared rays, thereby detecting the displacement of the key stroke to cause a sensing device to read the scan code on the X and Y coordinates.

Figure 2:
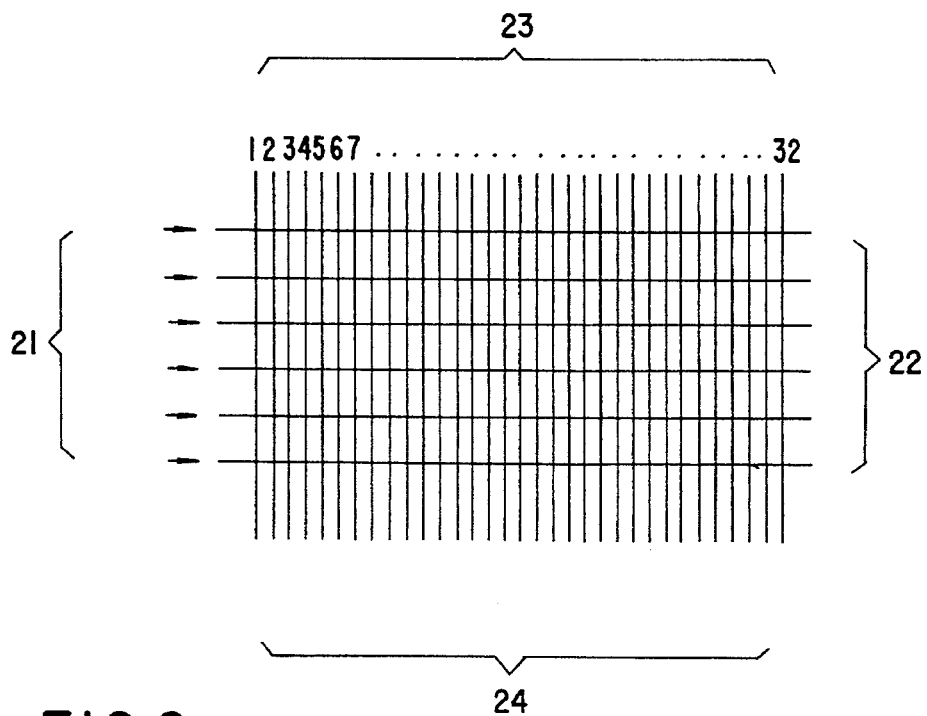
FIG. 2 is a view illustrating the arrangement of optical couplers adapted to the principle of the present invention.
Figure 3:
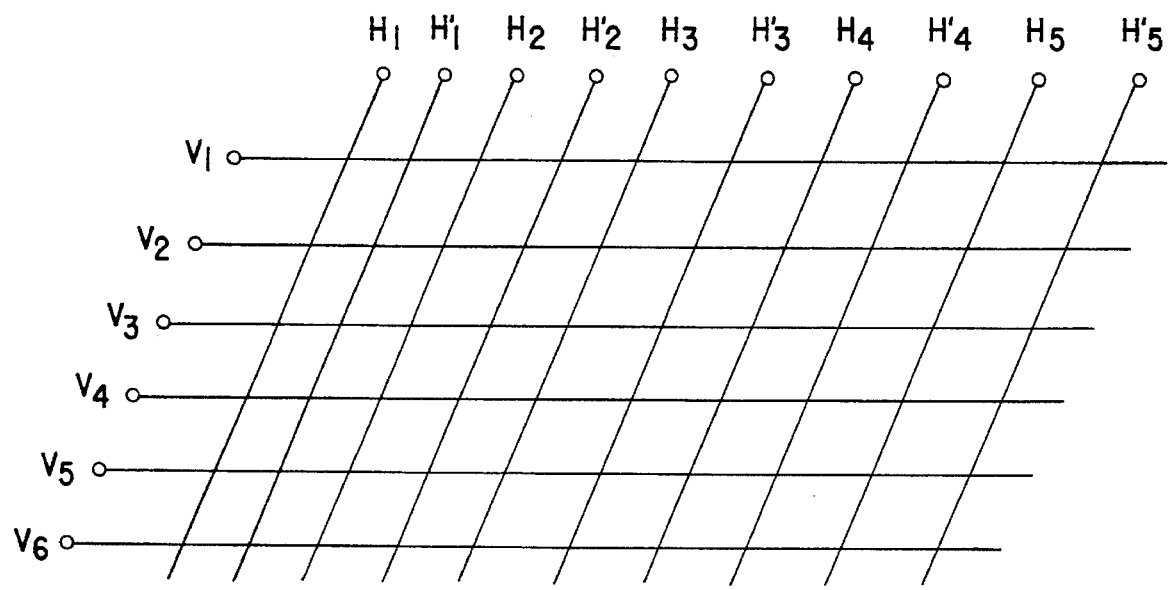
FIG. 3 is a view illustrating the adaption of the switching functions of the key tops to a dot matrix according to the principle of the present invention.
Figure 4:
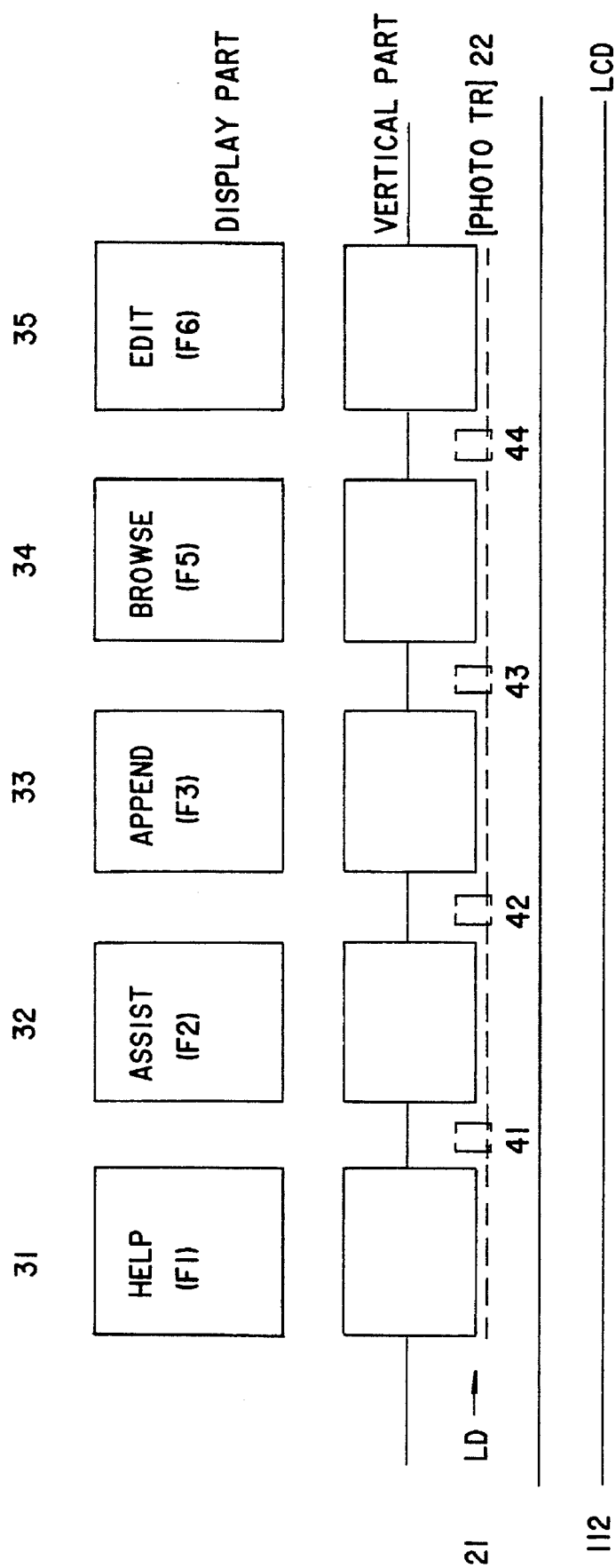
FIG. 4 is a schematic view illustrating the display state of the function key tops according to the principle of the present invention.

According to the principle of the present invention, the key top switches are arranged as shown in FIG. 2, in which the vertical columns and horizontal rows form a matrix. A computer key board is similarly arranged in 6 columns * 32 rows of a minimized unit. The key matrix 20 has a light emitting diode group 21 positioned in the right columns of the drawing and a photo-transistor group 22 consisting of light receiving elements located in the left columns along the same line as the light emitting diodes. Also, a photo-transistor group 23 is arranged in the upper rows and a light emitting diode group 24 in the lower rows corresponding to the light receiving light elements. These arrangements form a switching matrix of columns V1 to V6 and rows H1 to H5 as shown in FIG. 3. It is based on the concept illustrated in FIG. 4.

Assuming that function key tops F1 to F12 are associated with an AT type key board is adapted to the software of a predetermined word-processor, the key top F1 or 31 a key top HELP, the key top F2 or 32 is a key top ASSIST, the key top F3 or 33 is a key top APPEND, and the key top F6 or 35 is a key top EDIT; each are made of transparent materials to represent a predetermined corresponding function. Below the bottom surface of these key tops a light emitting element group 21 and a photo-transistor group 22 receiving infrared rays are mounted in a matrix arrangement. The optical coupler groups 21 and 22 are provided with function key tops 31 to 35 which function as optical switches, on each of which opaque material or light interrupting devices 41 to 45 are mounted in the same line with the photo-coupler groups. An LCD type display device 112 is mounted below the bottom surface of light interrupting devices 41 to 45 to enable the function key tops 31 to 35 to represent the corresponding information as described in detail below.

Figure 9:
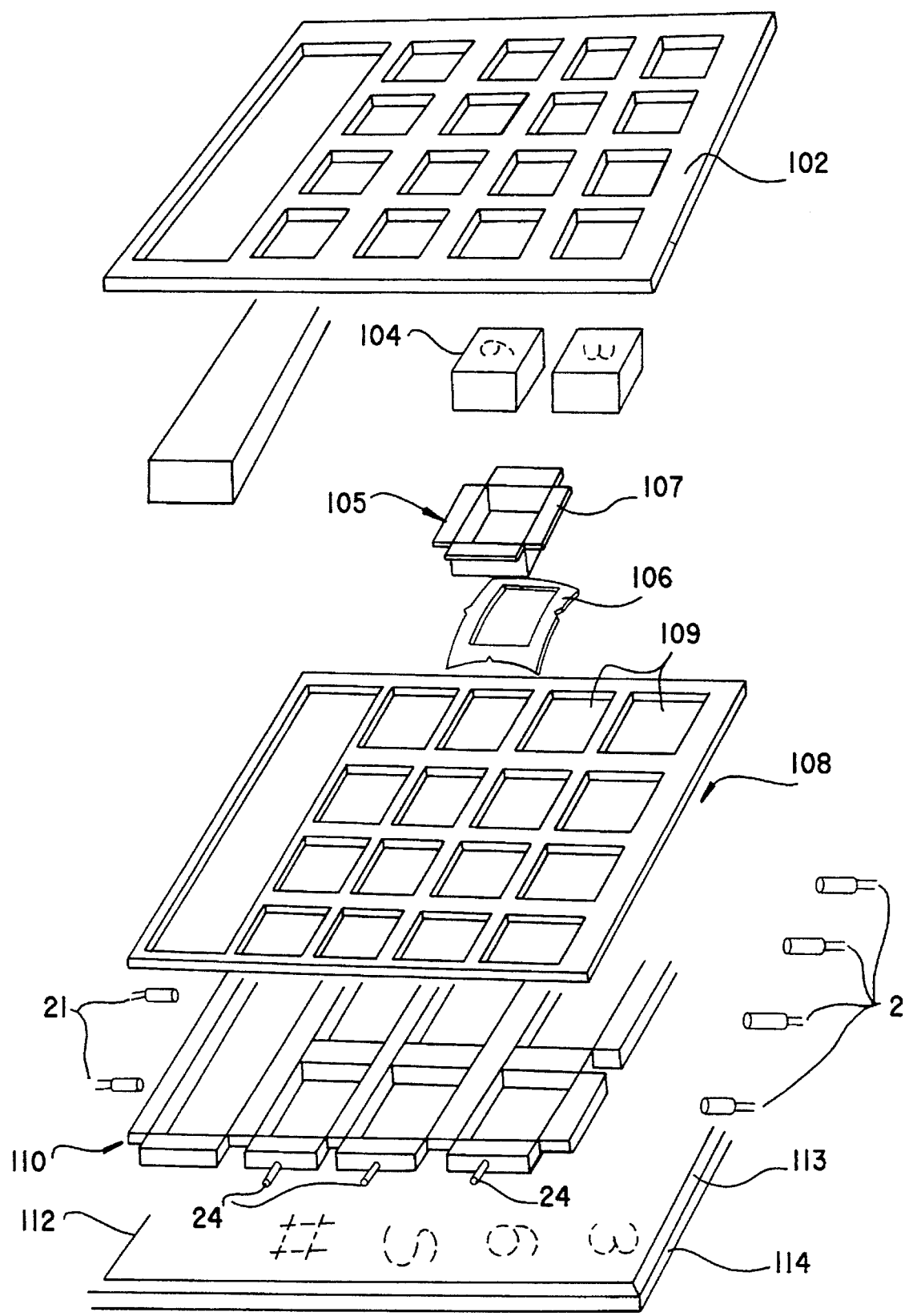
FIG. 9 and FIG. 10 are exploded perspective views illustrating the control key board of an electronic appliance according to the present invention.
Figure 10:
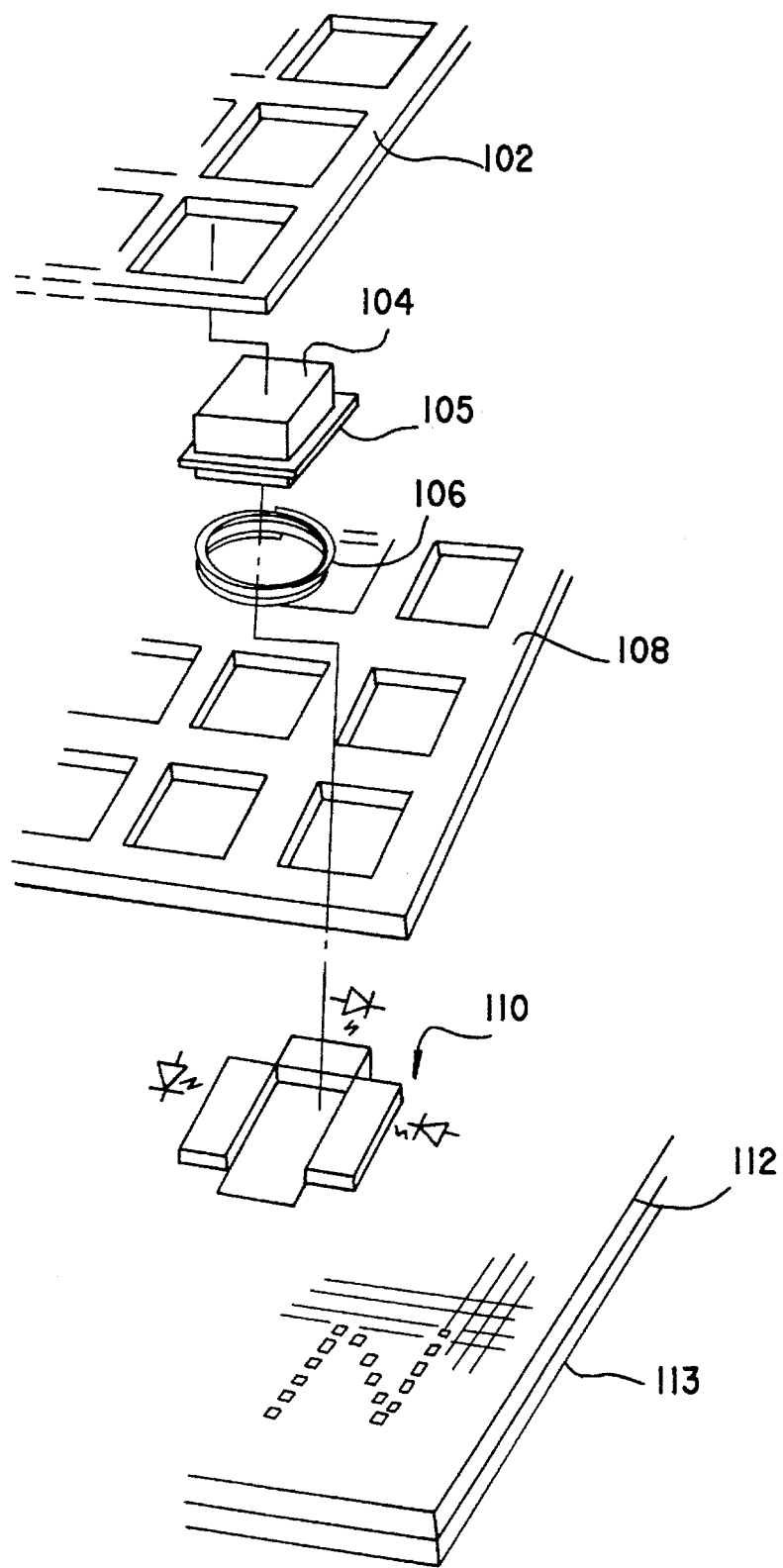

A typical example of the present invention adapted to a computer key board is illustrated in FIGS. 5, 6, 7 and 8. A typical example of the present invention adapted to a telephone key board or calculator key board of an electronic appliance is illustrated in FIGS. 9, 10 and 11.

Figure 5:
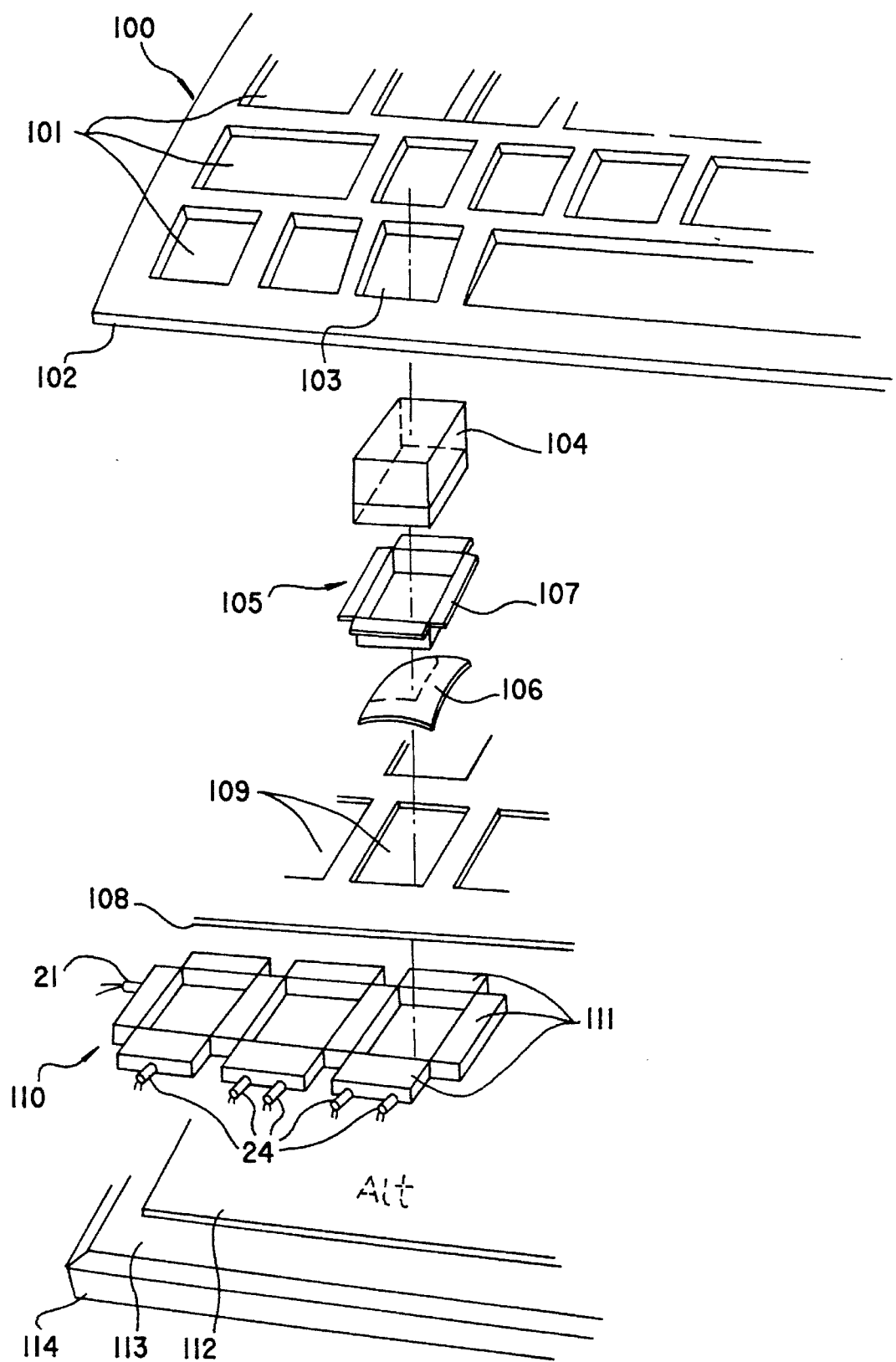
FIG. 5 is an exploded perspective view illustrating important components when the present invention is adapted to an AT type key board.

Referring to FIG. 5, a multipurpose optical intelligent key board apparatus 100 comprises a key board front plate 102 having a plurality of holes 101 for receiving corresponding key tops, respectively, which are arranged in a predetermined matrix. The key tops 104 are made of transparent materials, such as acryl resin, plastic, glass or crystal, in the form of a rectangular shape as shown in the drawing or another geometrical shape. The key top 104 is fitted into an optical interrupting device 105 constructed to wrap around its periphery at a predetermined height, in which the optical interrupting device 105 is made of metal or any other material capable of interrupting lightly.

The optical interrupting device 105 is provided with a flange 107 horizontally extended at the predetermined height from each surface of the key top 104, in which the predetermined height is set to allow the flange 107 to be elastically supported on the lower surface of the key board front plate 102 and to be contacted with a middle plate 108 when the key top 104 is pressed.

A leaf spring or coil spring 106 is supported on the middle plate 108, which has relatively small holes 109 formed in the same arrangement as that of holes 101 and 103... on the key board front plate 102, in order to elastically retain the key tops 104 together with the optical interrupting device 105. A plurality of optical guiders 110 are mounted adjacent to the bottom surface of the middle plate 108. A plurality of optical couplers are mounted to the optical guiders around the periphery of the key board front plate 102. The optical guiders 110 are configured to have the same arrangement as that of the holes 101 of the key board front plate 102, in such a manner that the photo-coupler groups, including the light emitting diodes and photo-transistors, are disposed on the front and rear portions and the left and right portions of the key board front plate 2. The drawing illustrates three light emitting diodes of the lower light emitting diode group 24 and one light emitting diode of the left light emitting diode group 21. In addition, the optical guiders 110 are configured to receive all optical interrupting devices 105 related with the respective key tops 104. A flat LCD type display device 112 is located below the bottom surface of the optical guiders 110 so that it can be divided to conform to the arrangement of the holes 101 on the key board front plate 102 to display the character or function of the key tops 104.

The liquid crystal display device 112 may be a dot matrix liquid crystal plate which displays information of the function key tops and the character key top according to the software programming. The liquid crystal display device 112 may have a luminescence plate 113 on its lower portion to meet the user's needs with respect to the background color.

All these components may be assembled into a base plate 114, and then the base plate 114 is coupled with the key board front plate 102 to complete the assembly of the multipurpose optical intelligent key board apparatus 100.

Figure 6A:
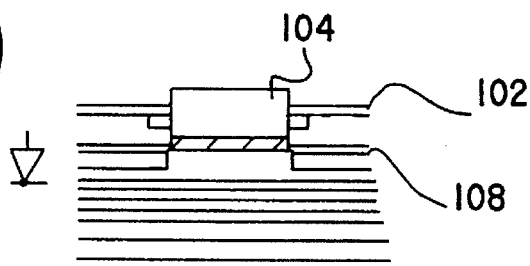
Figure 6B:
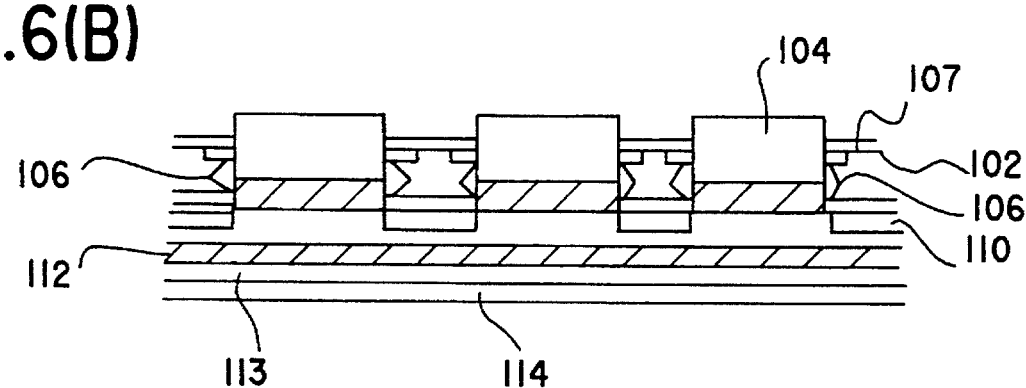
Figure 6C:
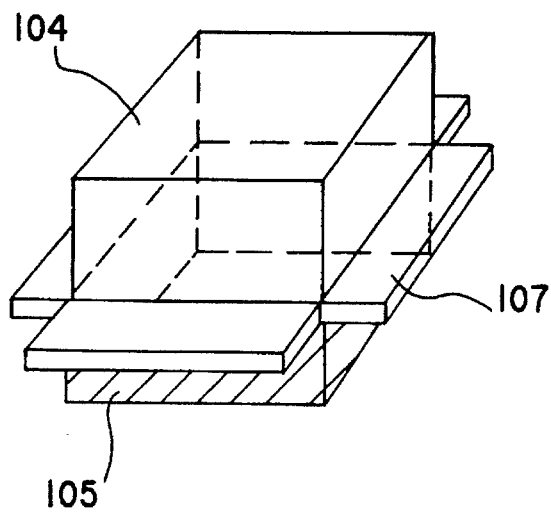
FIG. 6C is a perspective view of a key top and optical interrupting device according to the invention.

Specifically, as shown in FIGS. 6A, 6B, and 6C, a key top 104 is projected upward through a key board 102 while being supported by a leaf spring 106 between a middle plate 108 and a flange 107. An optical guider 110 is fixed to the lower surface of the middle plate 108. A display device 112, a luminescence plate 113 and a base plate 114 are arranged in order below and spaced from the bottom surface of the optical guider 110.

Figure 7:
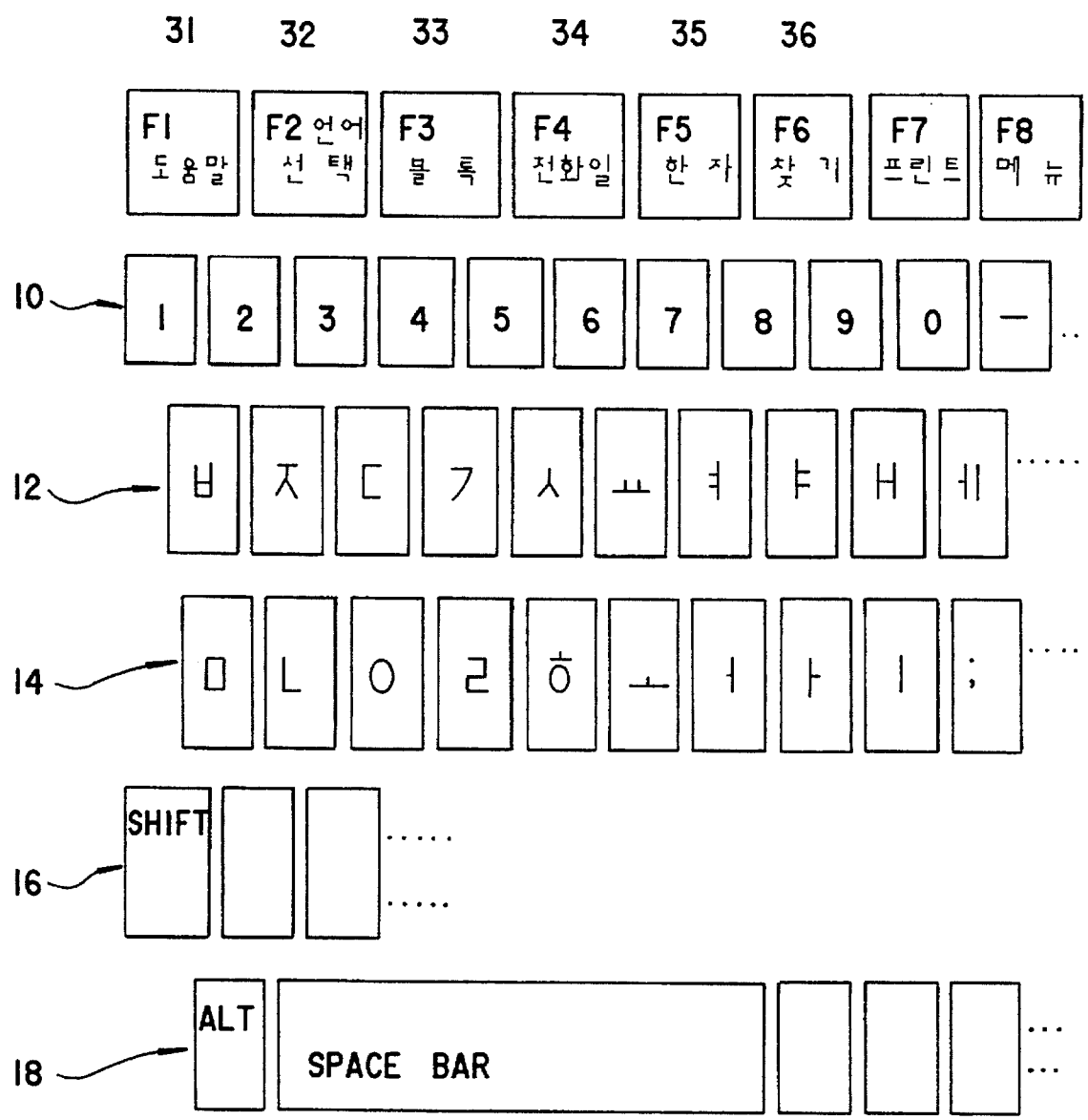
FIG. 7 and FIG. 8 are plan views illustrating the arrangement of a key board adapted to the English/Korean language word-processor according to the present invention.
Figure 8:
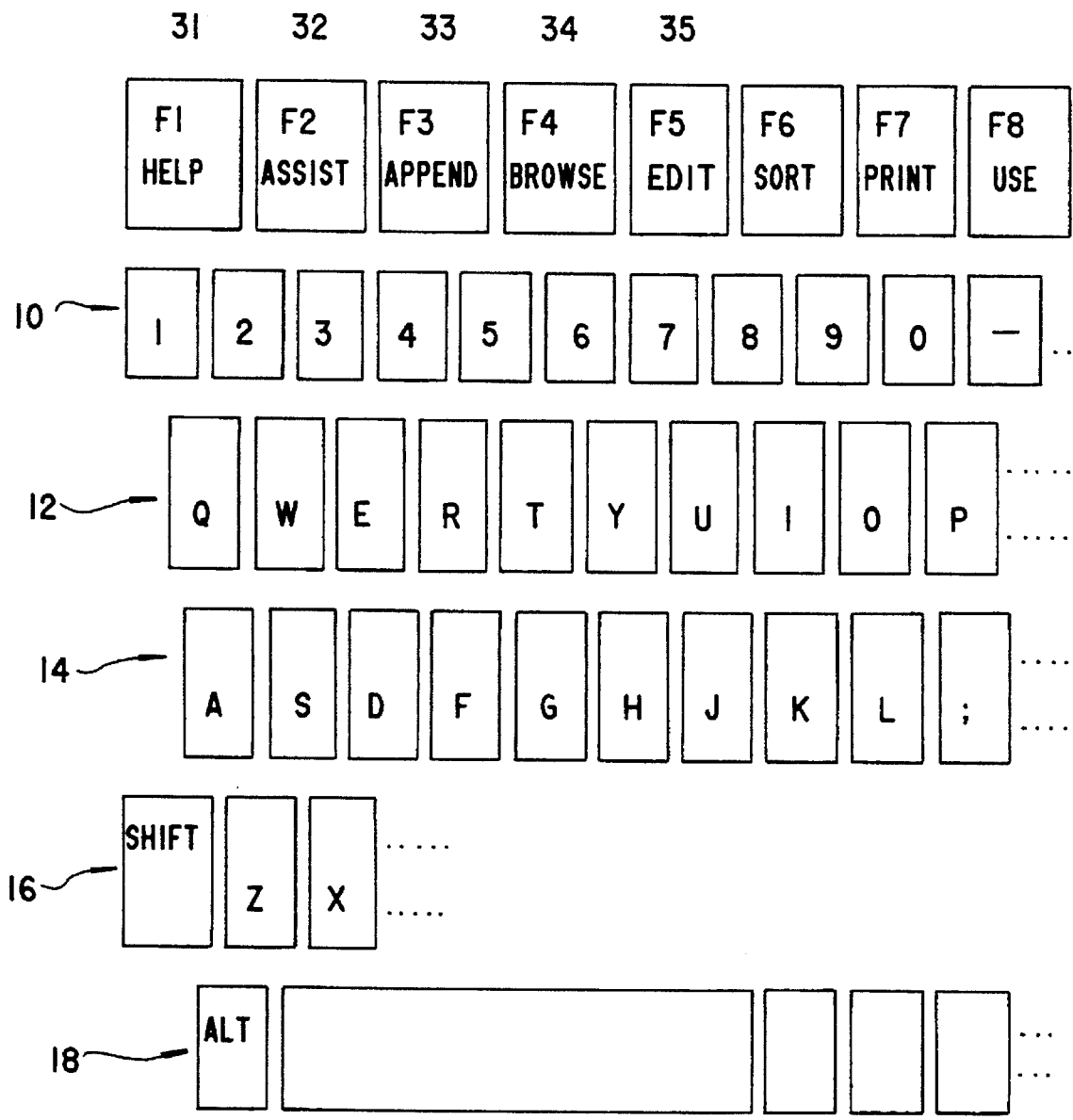

The multipurpose optical intelligent key board apparatus 100 can display information of the function/character key tops according to the software programming to be used as illustrated in FIGS. 7 and 8. Referring to FIG. 7, the functions of key tops 31, 32, 33, 34... illustrate its corresponding function in Korean characters, the figure key top group 10 represents only figures, the character key top groups 12 and 14 show the key functions corresponding to Korean characters and the key tops SHIFT and ALT of the other character key top groups 16 and 18 permit the corresponding functions to be visually perceived. The Korean display key tops may be represented in English as shown in FIG. 8. An explanation with respect to FIG. 8 is omitted because it is the same as the explanation for FIG. 7.

FIGS. 9 and 10 illustrate examples adapted to an electronic appliance, in which FIG. 9 is an exploded view of a calculator, and FIG. 10 is an exploded perspective view of a key board adapted to an electronic appliance.

The important components shown in FIGS. 9 and 10 are the same as those of FIG. 5, for which the same components are referenced by the same numbers, and their detailed explanation is omitted. The differences between FIG. 5 and FIG. 9 consist of the photo-transistor group 22 which includes a plurality of light receiving elements arranged in opposition of a light emitting diode group 21 including a plurality of light emitting elements, and a liquid crystal display device 112 displays characters associated with information corresponding to the key tops. The configuration of FIG. 10 is the same as that of FIG. 9, except that a leaf spring for elastically supporting key tops 104 is replaced by an elastic spring 106.

INDUSTRIAL APPLICABILITY

As described above, the present invention strengthens the support of a software program by use of to a liquid crystal display device for displaying not only the command words of the software but also the characters to be used, in which the key board connected to a computer is supplied with information about the function keys and character keys. Thus, the present invention can assist in the operation of the programming associated with a computer or an electronic appliance by providing users with optical representations of characters and functions on a plurality of key tops.

I claim:

1. An optical keyboard apparatus, comprising:
   a plurality of keys, each of said keys having a respective light interrupting means and a respective vertically light transmissive key top, the respective key top having a transparent lower end, the lower ends of the key tops having respective exposed lower faces and vertical side surfaces, the respective light interrupting means being formed of an opaque material at said vertical side surfaces;

a board having holes, said holes movably receiving said keys in a predetermined matrix array;

a plurality of light sources for generating respective light beams along respective paths below said array, arranged so that depression of the respective keys projects the light interrupting means thereof into the respective paths to interrupt the light beams in the respective paths;

a plurality of light sensors aligned with said paths for sensing passage of the light beams on said paths or interruption of the light beams by said interrupting means; and an optical display means, beneath said keys, for displaying character patterns on a surface below the keys, wherein said patterns are visible from above the keys through the respective key tops.

2. An optical keyboard apparatus according to claim 1, wherein the character patterns on the surface below the keys are vertically aligned with the respective keys.

3. An optical keyboard apparatus according to claim 2, wherein the optical display means is either an LCD display or an LED display.

4. An optical keyboard apparatus according to claim 1, further comprising means for changing the character patterns simultaneously.

5. An optical keyboard apparatus according to claim 1, wherein all of the character patterns are present at the surface simultaneously.

6. An optical keyboard apparatus according to claim 1 wherein said optical display means comprises a liquid crystal display device having a liquid crystal plate and a luminescence emitting plate, wherein said liquid crystal plate has respective light emitting groups spatially arranged directly below the respective keys, and wherein said luminescence emitting plate is disposed beneath said emitting groups.

7. An optical keyboard apparatus according to claim 1, further comprising:

an opaque middle plate having openings, said middle plate being disposed beneath said board and having a like configuration to said board, and a plurality of elastic means elastically supporting the respective keys on said middle plate.

8. An optical keyboard apparatus according to claim 7 wherein said optical display means comprises a liquid crystal display device beneath said middle plate, wherein said display device including a liquid crystal plate, wherein said liquid crystal plate has respective light emitting groups spatially arranged directly below the respective keys, and wherein said display device further includes a luminescence plate at a lower portion thereof beneath said emitting groups.

9. An optical keyboard according to claim 7, wherein said plurality of elastic means surround the respective key tops.

10. An optical keyboard according to claim 9, wherein each elastic means comprises a leaf spring.

11. An optical keyboard apparatus according to claim 1, wherein said key tops are formed of a transparent material selected from the group consisting of epoxy resin, acrylic resin, glass and crystal.

12. An optical keyboard according to claim 1, wherein said opaque material comprises metal.

* * * * *